United States Patent
Churchill et al.

(10) Patent No.: US 9,825,610 B1
(45) Date of Patent: Nov. 21, 2017

(54) TUNABLE STIFFNESS MECHANICAL FILTER AND AMPLIFIER

(71) Applicant: HRL Laboratories, LLC, Malibu, CA (US)

(72) Inventors: Christopher B. Churchill, Ventura, CA (US); Geoffrey P. McKnight, Los Angeles, CA (US); Raviv Perahia, Agoura, CA (US); Logan D. Sorenson, Agoura Hills, CA (US); Guillermo Herrera, Winetka, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/634,565

(22) Filed: Feb. 27, 2015

Related U.S. Application Data (60) Provisional application No. 61/946,703, filed on Feb. 28, 2014.

(51) Int. Cl.
*H03H 9/46* (2006.01)
*H03H 9/24* (2006.01)

(52) U.S. Cl.
CPC ............ *H03H 9/46* (2013.01); *H03H 9/2457* (2013.01)

(58) Field of Classification Search
CPC ......... H02N 1/008; H03H 2009/02496; H03H 9/02409; H03H 9/462; H03H 2009/02488; H03H 9/02275; H03H 9/02425; H03H 9/2447; H03H 9/2457; H03H 9/2463; H03H 9/46; B81B 3/007; G01P 15/0802
USPC ........................................................ 333/186
See application file for complete search history.

(56) References Cited

U.S. PATENT DOCUMENTS

| | | | |
|---|---|---|---|
| 3,435,385 A | 3/1969 | Cohen | |
| 6,471,883 B1 | 10/2002 | Fell et al. | |
| 6,943,484 B2 | 9/2005 | Clark et al. | |
| 7,098,757 B2 * | 8/2006 | Avazi | H03H 9/02 333/186 |
| 7,126,446 B2 | 10/2006 | Howell et al. | |
| 7,205,699 B1 | 4/2007 | Liu et al. | |
| 7,298,017 B1 | 11/2007 | Liu et al. | |
| 7,944,007 B1 | 5/2011 | Liu et al. | |
| 8,368,473 B2 * | 2/2013 | Nakamura | H03H 9/02259 331/107 A |
| 8,450,913 B1 | 5/2013 | Ayazi et al. | |
| 8,542,074 B2 * | 9/2013 | Nakamura | H03B 5/30 331/116 M |

(Continued)

OTHER PUBLICATIONS

C. T.-C. Nguyen, MEMS technology for timing and frequency control, IEEE Transactions on ultrasonics, ferroelectrics, and frequency control, Feb. 2007, pp. 251-270, vol. 54, No. 2.

(Continued)

*Primary Examiner* — Dean Takaoka
*Assistant Examiner* — Alan Wong
(74) *Attorney, Agent, or Firm* — Christopher R. Balzan, Esq.

(57) ABSTRACT

In an embodiment, a tunable stiffness mechanical filter is provided including an input coupler to a negative stiffness structure with a negative stiffness characteristic, and further including a tuner for tuning the negative stiffness structure. An output sensor is located along the negative stiffness structure. The filter may include an amplifier and/or a driver coupled between the output sensor and the negative stiffness structure.

25 Claims, 9 Drawing Sheets

(56) References Cited

U.S. PATENT DOCUMENTS

| | | | |
|---|---|---|---|
| 8,584,456 B1 | 11/2013 | McKnight et al. | |
| 8,629,739 B2* | 1/2014 | Quevy | H03H 3/0072 333/186 |
| 2013/0207746 A1 | 8/2013 | Gupta | |
| 2014/0048989 A1* | 2/2014 | Platus | F16F 15/04 267/140.5 |
| 2015/0180374 A1* | 6/2015 | Herder | H02N 2/188 310/329 |
| 2016/0097789 A1* | 4/2016 | Clark | G01P 15/0802 73/514.01 |

OTHER PUBLICATIONS

M. Pollinger, D.O'Shea, F. Warken, and A. Rauschenbeutel, Ultra-high-Q Tunable Whispering-Gallery-Mode Microresonator, Physical Review Letters, Jul. 2009, pp. 053901-1-05901(4), vol. 103, The American Physical Society.

A.J. Hudspeth, Making an Effort to Listen: Mechanical Amplification in the Ear, Neuron 59, Aug. 28, 2008, pp. 530-545, Elsevier Inc.

Tobias Reichenbach and A.J. Hudspeth, Unidirectional Mechanical Amplification as a Design Principle for an Active Microphone, Physical Review Letters, Apr. 2011, pp. 158701-1-158701(4), vol. 106, The American Physical Society.

Susan X.P. Su, Henry S. Yang, and Alice M. Agogino, A Resonant Accelerometer With Two-Stage Microleverage Mechanisms Fabricated by SOI-MEMS Technology, published in IEEE Sensors Journal, Dec. 2005, vol. 5, Issue 6, pp. 1214-1223, ISN 1530-437X.

Alabuzhev, et al. Vibration protecting and measuring systems with quasi-zero stiffness, 1989, pp. 1-100, Hemisphere Publishing Corporation.

Su, Susan Xiao-Ping, Compliant Leverage Mechanism Design for MEMS Applications, Dissertation for PhD in Mechanical Engeering, Univ. of Cal., Berkley; Spring 2001, pp. 1-246, avail. at http://best.berkeley.edu/~aagogino/papers/dissertation_susan_su.pdf.

Geoffrey P. McKnight, et al., U.S. Appl. No. 14/214,242, Title: Methods to dynamically alter the stiffness of nonlinear structures, filed Mar. 14, 2014.

Jacob M. Hundley, et al., U.S. Appl. No. 13/802,197, Title: Assembly with Negative Torsional Stiffness, filed Mar. 13, 2013.

McKnight et al., U.S. Appl. No. 13/837,957, entitled Enhanced Damping Materials Using Negative Stiffness Inserts, filed Mar. 15, 2013.

* cited by examiner

Prior Art

FIG. 1A

Prior Art

FIG. 1B

Prior Art

FIG. 1C

Prior Art

FIG. 1D

Prior Art

Prior Art

FIG. 3A

Prior Art

TUNABLE STIFFNESS MECHANICAL FILTER AND AMPLIFIER

CROSS REFERENCE TO RELATED APPLICATION

The present application claims the benefit of U.S. Provisional application 61/946,703, by Churchill et al., entitled TUNABLE STIFFNESS MECHANICAL FILTER AND AMPLIFIER, filed Feb. 28, 2014 herein incorporated by reference in its entirety.

BACKGROUND

The functionality of the mechanical filter has been replicated in electronic oscillators for more than 100 years. Recent interest in mechanical oscillators has been motivated by the fact that quality factor (frequency selectivity and noise threshold) of mechanical oscillators can be in excess of $10^6$ while small electronic oscillators have Q=5-10, and bulky expensive ones top out at Q=100.

It is also well known that applying force to the base of a clamped beam causes its stiffness to drop, until the structure eventually buckles into a higher order mode shape. There is a rich field using this technology for vibration protection and isolation systems, but in a fully passive/static manner. The basics are detailed by Alabuzhev (published book, "Vibration protecting and measuring systems with quasi-zero-stiffness").

It is also common to use a mechanical system as a filter/amplifier. An excellent review of this field is the article by Nguyen, entitled "MEMS Technology for Timing and Frequency Control," IEEE Trans., Vol 54, Num 2. All current filters include some high-quality resonating portion, a driving portion, and a sensing portion. FIGS. 1A-1E depict several examples from this reference. None of them are tunable. Shown in FIG. 1A-1E are a Clamped-Clamped Beam 100a, a Free-Free Beam 100b, a Wine-Glass Disk 100c, a Countour-Mode Disk 100d, and a Spoke-Supported Ring 100e, respectively.

Figure 1A:
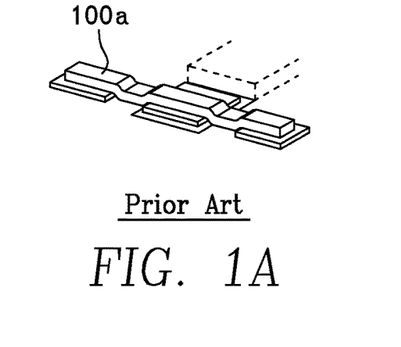
FIGS. 1A-1E illustrate prior art single frequency MEMS oscillators for filtering applications.
Figure 1B:
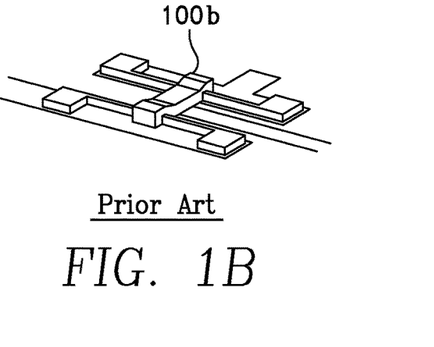
Figure 1C:
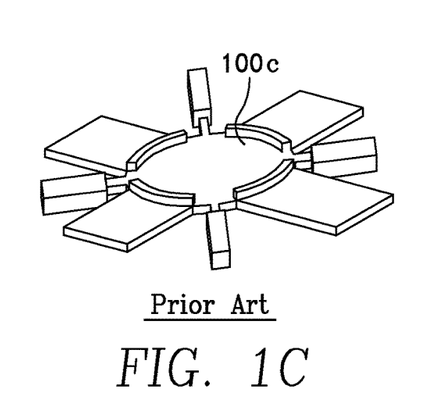
Figure 1D:
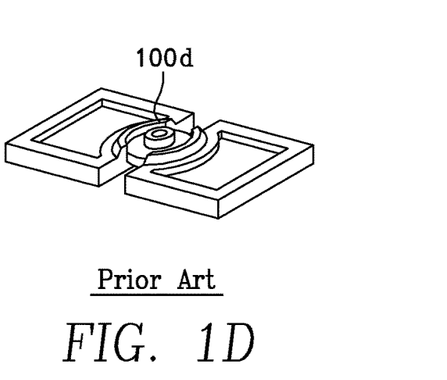
Figure 1E:
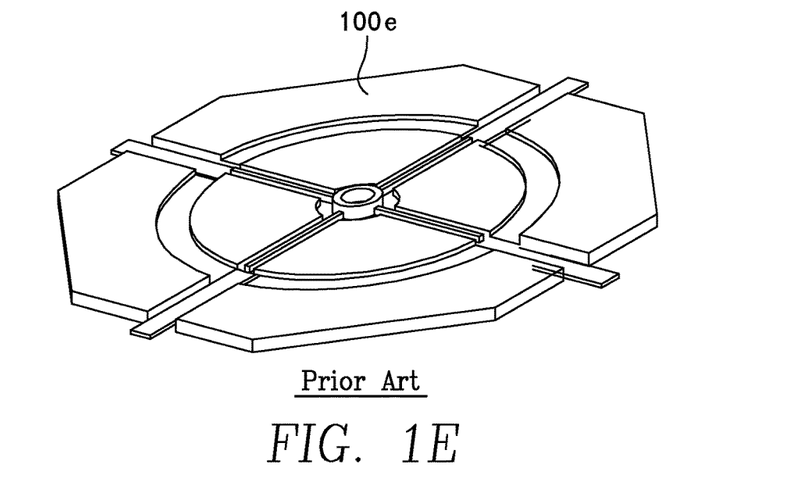
Figure 2:
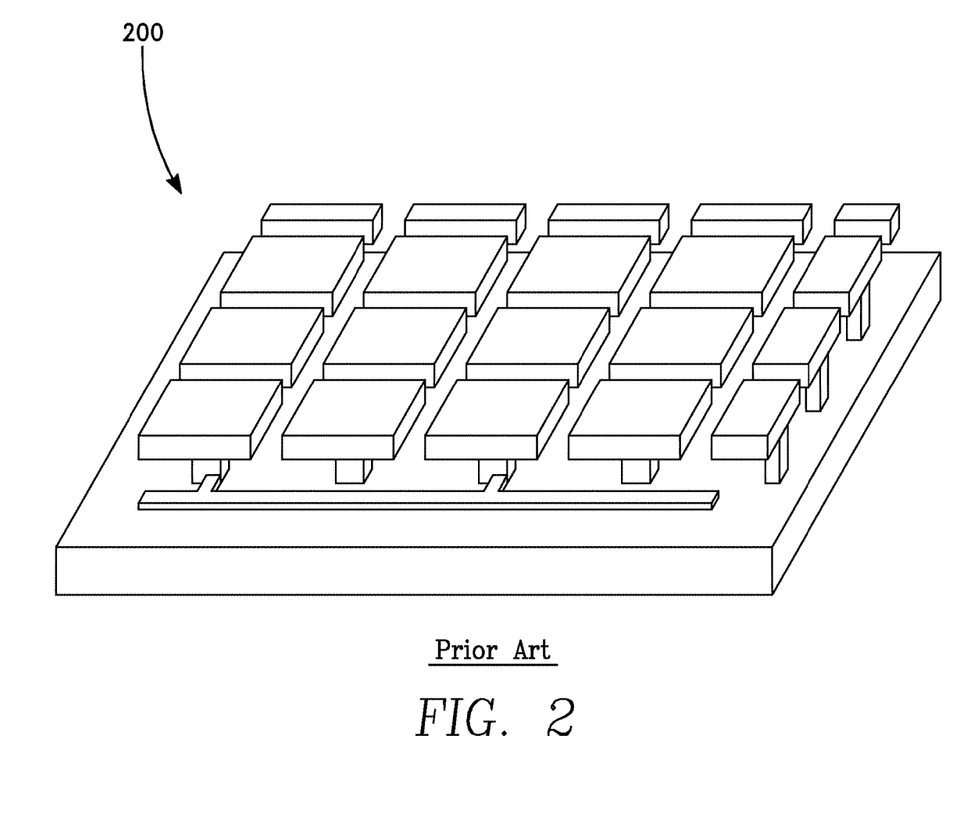
FIG. 2 is a perspective view of a prior art array of optical oscillators for multiple-channel (broadband) filtering.

If one wishes to create a broadband mechanical oscillator, the current state of the art is to create an array of oscillators. This has limitations, in that one resonator needs to be manufactured for each frequency. A good example of this is in U.S. published patent application 20130207746 A1, which describes an array 200 of square-plate oscillators, shown in FIG. 2.

Figure 3A:
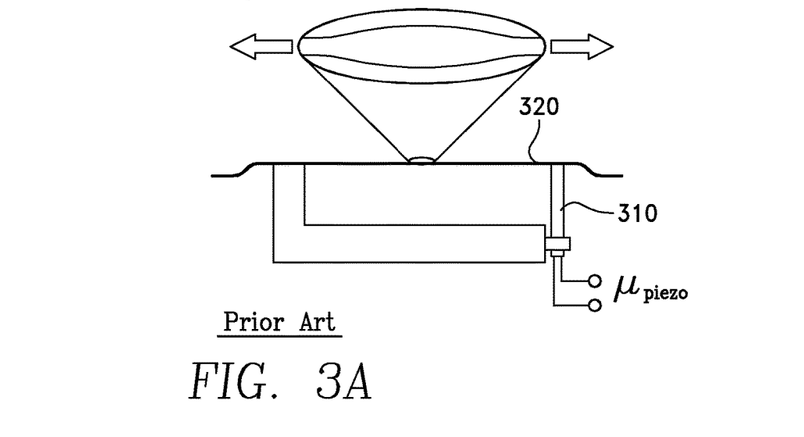
FIG. 3A is an illustration of a prior art tunable optical resonator.
Figure 3B:
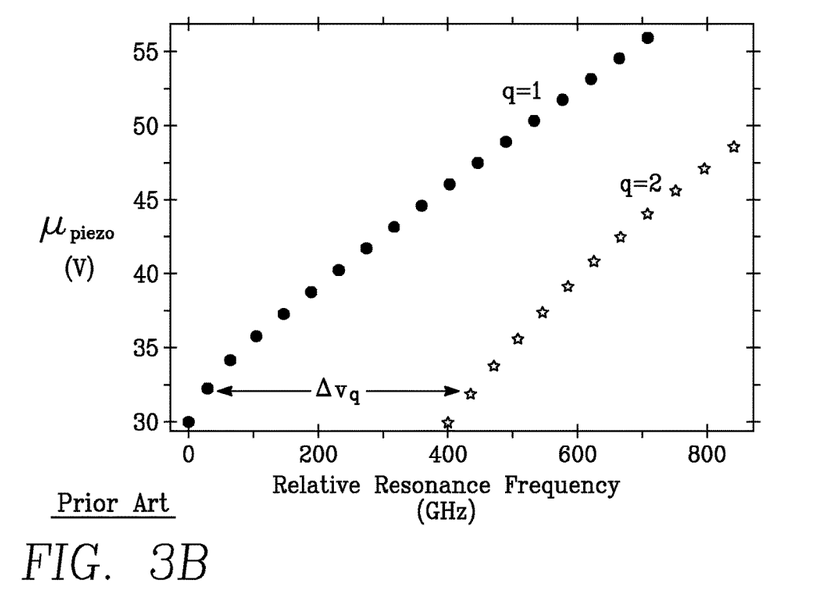
FIG. 3B is a plot illustrating an example of the relative resonance frequency versus voltage for the piezoelectric bending actuator of FIG. 3A.

Optical resonators, however, may be tuned by altering the geometry of their resonator. For example, the article by Pöllinger, M. et al. entitled "Ultrahigh-Q Tunable Whispering-Gallery-Mode Microresonator" describes a tunable optical resonator 300, which uses a piezoelectric cantilever 310 to vary the tension in an optical fiber 320, as shown in FIG. 3A. FIG. 3B is a plot illustrating an example of the relative resonance frequency versus applied voltage $U_{piezo}$ for the resonator 300 of FIG. 3A.

It is also possible to tune the resonant frequency of a mechanical oscillator by changing its elastic constant, via a phase change or field coupling. A classic example more than 50 years old is the YIG filter, as disclosed in U.S. Pat. No. 3,435,385, which uses a magnetic field to tune the resonance of a ferroelectric sphere. YIG filters are orders of magnitude larger than practical for some applications, are expensive, and power hungry. Another example is tuning the resonator via an electric field applied to an integrated piezoelectric substrate, as shown in U.S. Pat. No. 6,943,484 B2. The frequency range for this method is low and the piezoelectric can spoil other properties of the resonator.

Another very common example is tuning via capacitive "virtual" springs, as described in U.S. Pat. No. 8,450,913 B1. These work well, but only in a very narrow range (0.01% frequency change) as capacitive springs are very weak and nonlinear at even moderate displacements. They are only used for "trimming" small defects and our invention surpasses their range by at least 1000×.

There is also prior art for coupling the oscillator to a physical body and amplifying mechanical signals, i.e. a single frequency from a microphone diaphragm. This is the principle that many biological organisms use for hearing, using a chemical "drive circuit" on a mechanical amplifier (typically hair bundles) to detect a single sound frequency. These structures even have built-in frequency tuning, but they use chemical/biological mechanisms which cannot be transitioned to integrated circuits. (Hudspeth, "Making an effort to listen: mechanical amplification in the ear," Neuron, 2008) The amplifier concept has been applied to a physical microphone by Reichenbach, in "Unidirectional Mechanical Amplification as a Design Principle for an Active Microphone" but does not possess the desired tunability.

What is needed is a single resonator that functions across a continuous bandwidth rather than discrete channels. Moreover, what is needed is a tunable resonator mechanism allowing a high degree of tuning. Furthermore, what is needed is a mechanical, rather than optical resonator.

SUMMARY

In at least one embodiment, a tunable stiffness mechanical filter is provided which includes an input coupler to a negative stiffness structure with a negative stiffness characteristic. The tunable stiffness mechanical filter, further includes a tuner for tuning the negative stiffness structure. An output sensor is located along the negative stiffness structure. The filter may include an amplifier and/or a driver coupled between the output sensor and the negative stiffness structure.

In various embodiments, the tunable stiffness mechanical filter has a tuner coupled to at least one end of a negative stiffness member to allow application of a compressive tuning force to the negative stiffness member along a tuning axis. The input coupler is adapted to receive an input signal, transverse to the tuning axis, for causing displacement of the negative stiffness member. An output sensor is positioned to sense at least one of: (1) a displacement; (2) a velocity; or (3) an acceleration of the negative stiffness member.

In some embodiments, a first end of the negative stiffness member is fixed and a second end of the negative stiffness member is coupled to the tuner. Further, in some embodiments, the second end is clamped to inhibit rotation of the negative stiffness member while allowing compression of the negative stiffness member along the tuning axis. In further embodiments, the negative stiffness member may have flexure features. In still further embodiments, a positive stiffness member is coupled in parallel with the negative stiffness member, and may also have flexure features.

In some embodiments, the tuner may include an electrostatic actuator, an electromagnetic actuator, a magnetostrictive actuator, a thermal actuator, an electrochemical actuator, ionic actuator, or/and a piezoelectric. In one embodiment, this may include securing the negative stiffness member to a piezoelectric substrate. In some embodiments, the filter may further employ a lever system.

In at least one embodiment, a tunable stiffness mechanical filter is provided having an input coupler adapted to couple an input force to a negative stiffness member with an output sensor positioned to sense a response of the negative stiffness member to the input force. A tuning actuator is coupled to the negative stiffness member so as to adjust the response of the negative stiffness member to the input force. A drive portion may be coupled to provide feedback from the output sensor to the negative stiffness structure.

In some embodiments, the negative stiffness member is secured at one end such that application of a tuning force by the tuning actuator at another end of the negative stiffness member compresses the negative stiffness member to adjust the response of the negative stiffness member to the input force. The drive portion amplifies and feeds back the response of the negative stiffness member.

In various embodiments, a tunable stiffness mechanical filter is provided which includes a variable stiffness beam having a variable stiffness characteristic tuned through application of a compressive force via a tuner to at least one end of the variable stiffness beam. It further includes an input coupler to supply an input to the variable stiffness beam, and a sensor adapted to sense at least one of a displacement, a velocity, or an acceleration of the variable stiffness beam. In some embodiments, the tuner is capable of application of sufficient force to change the stiffness of a negative stiffness beam more than about 5% to up to about 200%.

DESCRIPTION OF THE DRAWINGS

These and other features, aspects, and advantages of the present invention will become better understood with reference to the following description, appended claims, and accompanying drawings where:

DESCRIPTION

Various embodiments are able to create similar functionality as conventional arrays containing many frequency unique resonators, but with only a single resonator and across a continuous bandwidth rather than discrete channels. Further, in contrast to conventional approaches, various embodiments of the present invention do not tune the elastic modulus or other material properties, and are therefore fundamentally different than the other approaches. Further, what can be avoided is the use of external fields which would otherwise tend to drive the size of the device up, and spoil other devices (ie. magnetometers) in the same integrated package. As an additional advantage of some embodiments is that they are able to surpass the range of the capacitive tuned "virtual" springs by at least 1000×.

Various embodiments of the invention provide a mechanical oscillator which utilizes negative stiffness of a pre or post-buckled beam to obtain an extremely wide range of operating frequencies. As will be described below, such an embodiment can be illustrated as being broken into several pieces, each of which are functionally separate, but, may in some cases be combined in a single structure. These are a variable negative stiffness portion, a static (or variable) positive stiffness portion, and a stiffness tuning portion. In addition, the system utilizes a drive portion, a coupling portion, and a sense portion.

At least one embodiment, realizes several advantages over the state of the art. First, because it is a structural method it can be adapted to a variety of materials, and is not restricted to certain thermal, electrical, or magnetic field requirements (as are many adjustable frequency oscillators). Second, because it utilizes negative stiffness to tune its frequency, the frequency "floor" is only limited by the noise in the tuning method, and not any material or structural limit. Third, the stiffness of the structure in its oscillation mode, even under extreme stiffness tuning, remains highly linear and amplitude insensitive. This gives more predictable behavior. Finally, because this system is broadly tunable, it is largely immune to common MEMS manufacturing challenges of thermal sensitivity, residual stresses, and precision.

Various embodiments can be used in many applications as an excellent broadband mechanical amplifier. When weakly coupled to a secondary system (microphone diaphragm) and perfectly matched in frequency (using the frequency tuning ability), this oscillator will tend to amplify the motion of the $2^{nd}$ system while simultaneously rejecting noise. While static mechanical amplifiers perform this task well, it is typically only at a single frequency, or at best a small band of adjacent frequencies. In various embodiments of the present invention, every frequency from (nearly) 0 Hz all the way to the positive stiffness portion frequency is accessible. This tuneability is typically 10-10000 times greater than SOA methods.

Another application is in generic signal amplification and filtering. If a broadband RF signal is passed into an embodiment through a coupling actuator, the response of the resonator will reflect only the portion of the signal surrounding the resonant frequency. By tuning the resonance, a large spectrum can be continuously swept and sampled using only a single device.

The concept of continually varying the stiffness of a system by inserting an actuator at the boundary of a beam/spring is shown in U.S. Non-provisonal application Ser. No. 14/214,242, filed Mar. 14, 2014, entitled METHODS TO DYNAMICALLY ALTER THE STIFFNESS OF NONLINEAR STRUCTURES, herein incorporated by reference in its entirety. With the present application, instead of isolation, various embodiments are capable of performing sensing and/or amplification. Various embodiments of this invention are well suited for small devices, typically can be fabricated using MEMS technology at sizes <5 mm.

Figure 4:
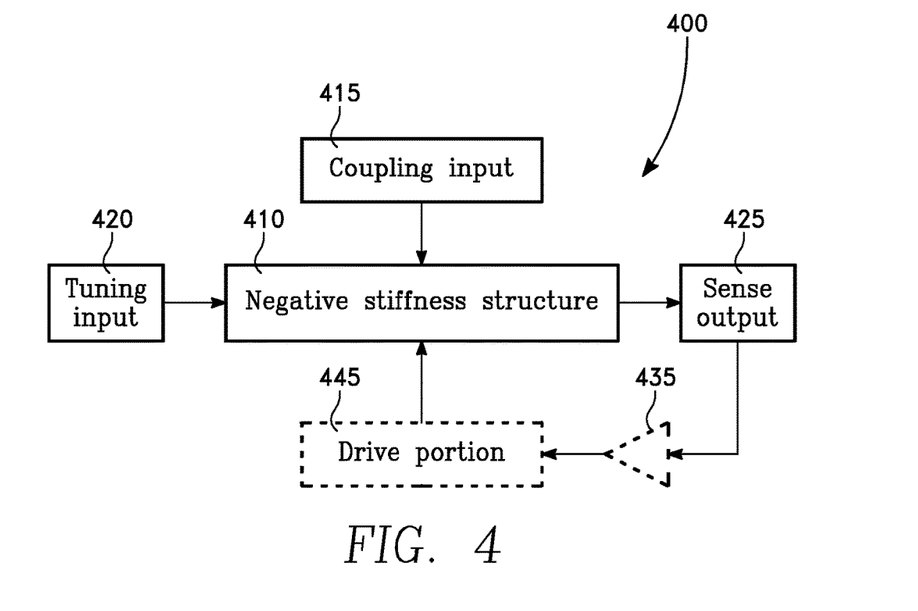
FIG. 4 is a simplified block diagram of an embodiment of the present invention.

FIG. 4 shows a simplified functional block diagram 400 of an embodiment of the invention. Conceptually, it can be broken into 5 parts. The tuner or tuning input 420 allows the resonant frequency to change, by structurally softening the negative stiffness (NS) oscillator. The coupling input 415 is typically quasi-static and changes at a rate at least 100× slower than the resonant frequency. The coupling input 415 represents the signal to be sensed, or amplified, which can be any broadband signal coupled to the negative stiffness structure 410. Negative stiffness or bistable characteristic is described in U.S. Pat. No. 8,584,456, by Geoffrey McKnight, filed May 21, 2010, issued Nov. 19, 2013 entitled BISTABLE ACTUATOR MECHANISM, and in U.S. patent application Ser. No. 13/837,957, by McKnight et al., filed Mar. 15, 2013, entitled ENHANCED DAMPING MATERIALS USING NEGATIVE STIFFNESS INSERTS, both herein incorporated by reference in its entirety. More specific examples of coupled inputs will be given below, but they include physical motions/forces as well as electronic signals. The sense output 425 can be a transducer, preferably capacitive, which senses the velocity or position of the resonator. This sense output 425 can be fed back into an optional drive portion 445 (via an optional amplifier 435) to provide enhanced closed-loop amplification. The drive portion 445 may not be essential if the amplitude from the coupling input 415 is relatively large, but in most cases will be desirable, as a large-amplitude coupling input can rarely be guaranteed.

Like some mechanical filters, the sense signal may be over a narrow frequency range (that of the resonant frequency of the mechanical portion) and contain a lower noise component than the broadband coupling signal. With the addition of a drive portion 445, it can be of higher amplitude as well.

Figure 5:
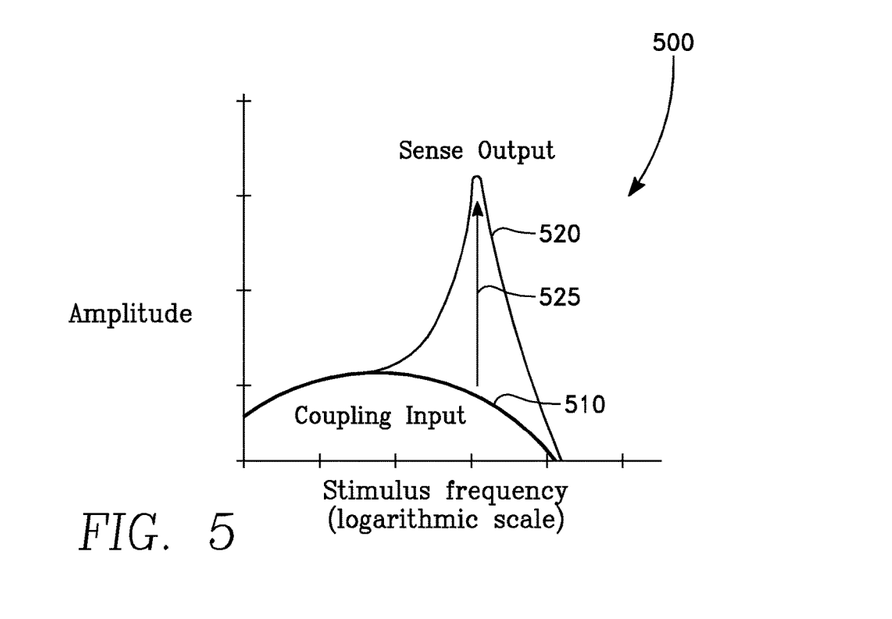
FIG. 5 shows a plot of stimulus frequency versus amplitude of a mechanical filter.

FIG. 5 shows a plot of the typical output of the resonator, which will tend to amplify signals at its resonant frequency (shown by arrow 525). FIG. 5 shows a plot of stimulus frequency (logarithmic scale) versus amplitude of a mechanical filter. The mechanical filter amplifies the coupling input 510 at the sense output 520 over a narrow frequency. Again, this resonant frequency 525 is controlled by the tuning input 420 (FIG. 4).

Figure 6A:
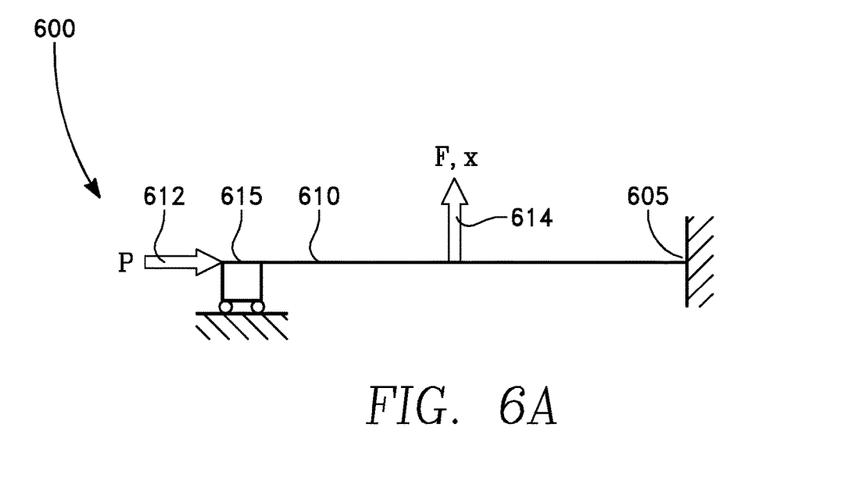
FIG. 6A shows a clamped-clamped beam embodiment.
Figure 6B:
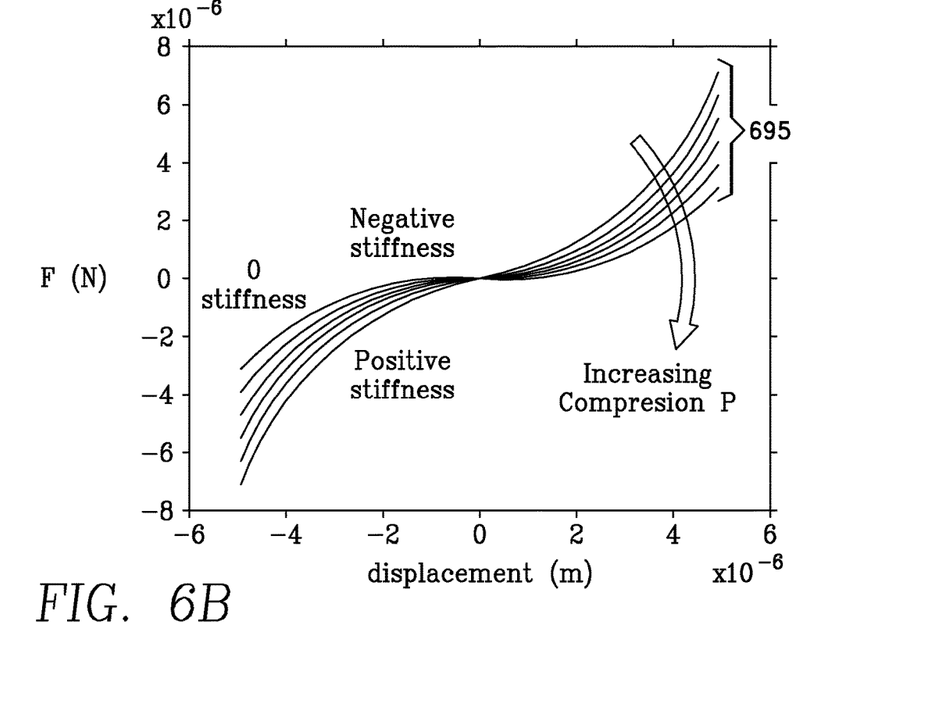
FIG. 6B illustrates a plot of the response curves for the embodiment of FIG. 6A.

FIG. 6A shows a side view of a clamped-clamped beam embodiment 600, and FIG. 6B illustrates a plot of the response curves 695 for the embodiment 600 of FIG. 6A. Shown in FIG. 6B is an illustration of an exemplary negative stiffness ranges from linear to cubic constitutive behavior. These are response curves 695 for an embodiment, which in practice would only use <500 nm of amplitude and therefore have a nearly perfectly linear response.

In the embodiment of FIG. 6A, the negative stiffness portion comprises a clamped-clamped beam 610, with one built-in boundary or end 605 and a second boundary or end 615 clamped against rotation but free to move axially. Without compression P, the beam 610 vibrates in response to a force F at input coupler 614 with some positive stiffness, which is linear at small to moderate amplitudes. The vibration frequency is proportional to the square root of the stiffness, $\omega=(k/m)^{1/2}$ where m is the effective mass at the center of the beam. This full positive-stiffness frequency is the highest possible operating frequency of the oscillator. The beam 610 can only reduce its frequency from there. As compression force P is applied by a tuner 612, illustrated by arrow at 612, at the free end 615, the beam 610 stiffness decreases. This stiffness decrease is proportional to the applied force by tuner 612, as described by the equation below. Here, k is the stiffness, E is the beam material modulus, w the beam width, h the height (thickness), beta a slenderness ratio (thickness over length). Alpha is the dimensionless compression ratio, $(P/P_{cr}-1)$ where P is the compression and $P_{cr}$ is the compression required to achieve zero stiffness, $4*pi^2*E*I*L^{-2}$.

$$k = \frac{dF}{dx} = \frac{1}{6}\pi^4 E w \beta^3 (-\alpha)$$

Figure 7A:
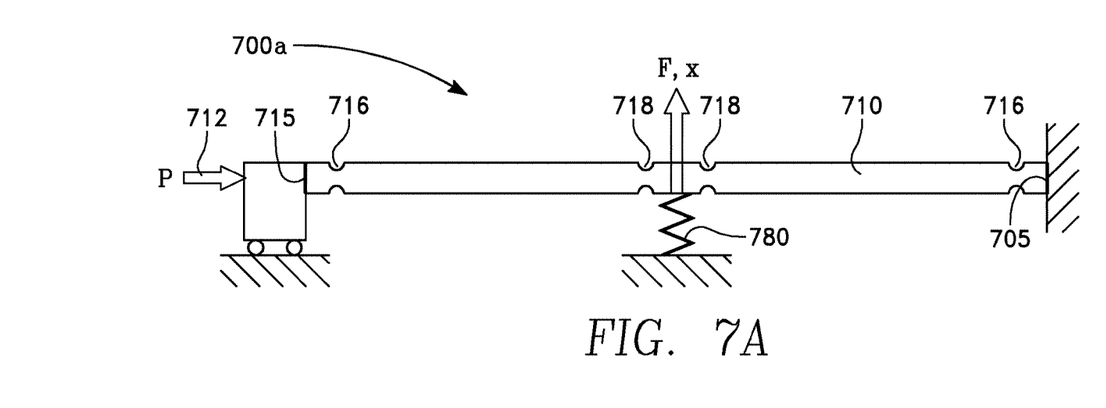
FIG. 7A is a side view of an illustration of alternate embodiment with separate positive and negative members.
Figure 7B:
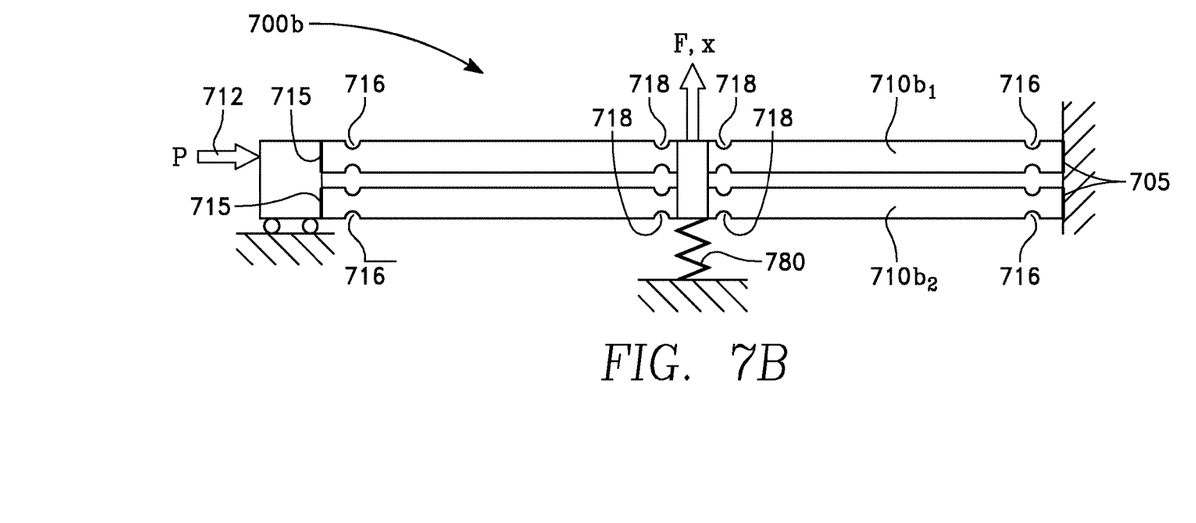
FIG. 7B is a side view of an illustration of alternate embodiment with separate positive and negative stiffness members.

The same effect can be obtained with pinned boundary conditions 705 and 715, created by adding flexure features, 716 and 718 at the base 705 and center 707 of the beam 710, as shown in FIG. 7A. FIG. 7A is a side view of an illustration of alternate embodiment with separate positive and negative members 780 and 710, respectively. FIG. 7B is a side view of an illustration of alternate embodiment stabilized against rotation with separate positive and negative stiffness members, $710b_1$ and $710b_2$, respectively. In these cases, an additional positive spring 780 may be desired to add stiffness (the exact relationship depends on the flexure design), but in the end, the (negative) stiffness is still proportional to the end compression P (arrow 712), and the small-amplitude behavior is linear. The positive stiffness spring $710b_2$ would be configured as a beam member in parallel that is rigidly connected to the tunable negative stiffness member $710b_1$. This positive stiffness spring $710b_2$ would be separate from the negative stiffness member $710b_1$ such that the tuning actuator for the negative stiffness member $710b_1$ would not affect the positive stiffness spring $710b_2$, as shown in FIG. 7B. The positive stiffness spring $710b_2$ could also take the form of a circular or rectangular plate or other configurations that provide the desired compliance including curved beams or assemblies of curved beams such as a ring geometry. The mechanism which applies the compression load P (arrow 712) is referred to as the "tuning" portion or tuner. This can have any number of actuation mechanisms compatible with micro-fabrication. The force F is applied across or transverse (non-aligned with the compressive force P).

Figure 8:
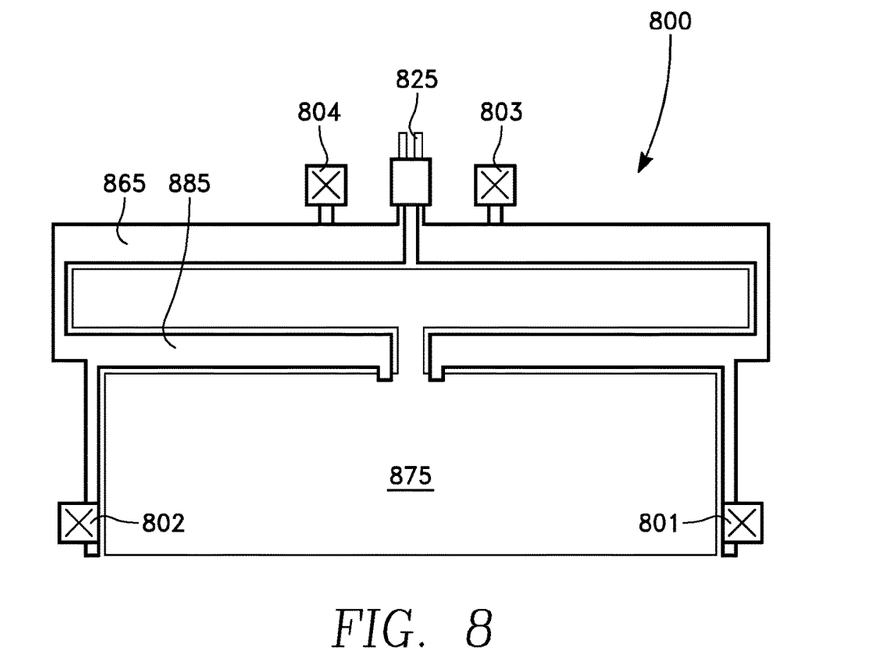
FIG. 8 is a top view of an illustration of a typical MEMS leverage system.

FIG. 8 is an illustration of a MEMS lever 800, such as is disclosed by Susan X. P. SU, Henry S. YANG, and Alice M. AGOGINO, in A Resonant Accelerometer With Two-Stage Microleverage Mechanisms Fabricated by SOI-MEMS Technology, published in IEEE Sensors Journal, Dec. 2005, Vol. 5, Issue 6, pp. 1214-1223, ISN 1530-437X, which could be situated between the actuator (electrostatic) and the beam, not shown in FIG. 8. With this system, force from a proof mass 875 is amplified about 80× to the output at the top of FIG. 8. The lever 800 has a first lever 865 and a second lever 885, and anchors 801-804.

Figure 9:
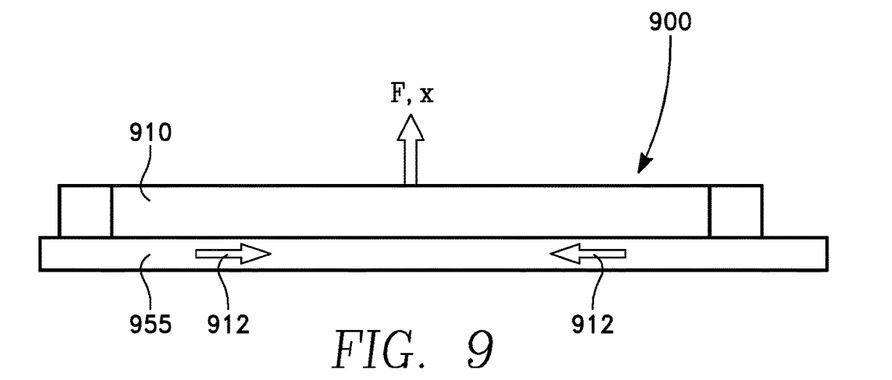
FIG. 9 shows an embodiment that employs a piezoelectric substrate for tuning.

In one version, shown in FIG. 9, the entire structure 910 is built on a piezoelectric substrate 955. As a voltage is applied to the substrate 955, it will contract uniformly, applying compressive pressure 912 to the negative stiffness structure 910. Other actuators for applying a controlled force to the structure are an electromagnetic coil (if the device is inside a strong magnetic field), capacitive plate, capacitive comb drive, magnetostrictive actuator, or leveraged versions of all mentioned.

Another method for actuating the beam is a thermal actuator based on coefficient of thermal expansion (CTE) effect of an adjoining structure. The thermal actuator could be composed of any material with a significant coefficient of thermal expansion. Ideally this system would be maintained in a separate thermal environment from the resonator to limit the changes in the resonator beam from temperature effects.

Another approach for actuation is the use of ionic or electrochemical actuation (i.e. ionic intercalation such as potassium into graphite which expands the gap between the graphite sheets). Ionic intercalation can be used to store an electrochemical potential in the negative stiffness portion. The electrochemical potential may be measured and used to sense the state of the negative stiffness portion. While fluidic ionic systems could be used, the potential use of an evacuated chamber for the resonator makes a solid state ionic system particularly attractive for actuation. Many energy storage materials undergo volumetric change during the change from one phase to another. This volumetric change can be used to apply significant loads to structures. One example of solid state actuation is disclosed in U.S. Pat. No. 7,205,699, by Liu et al., entitled SOLID STATE ACTUATION USING GRAPHITE INTERCALATION COMPOUNDS, issued on Apr. 17, 2007, herein incorporated by reference in its entirety. Furthermore, U.S. Pat. No. 7,944,007, by Liu et al., entitled ACTUATOR ASSEMBLY, issued May 17, 2011, and U.S. Pat. No. 7,298,017, by Liu et al., entitled ACTUATION USING LITHIUM/METHAL ALLOYS AND ACTUATOR DEVICE, both herein incorporated by reference in their entireties, also disclose volume changing materials that undergo a volume change in response to ionic insertion or removal to the volume changing material. Other ionic or electrochemical actuation devices or methods are possible.

Figure 10:
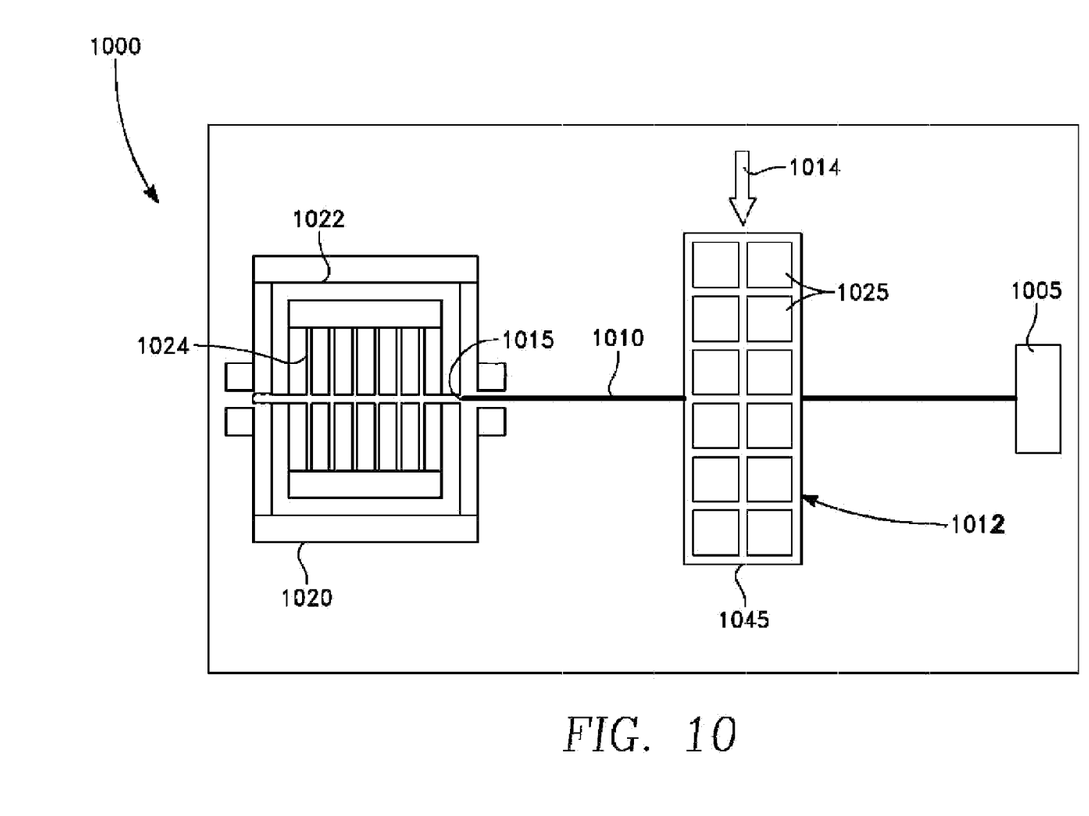
FIG. 10 is a top view illustration of a possible embodiment in accordance with the present invention.

FIG. 10 shows the structure of one example embodiment 1000. In this embodiment, a 1 millimeter beam 1010 is clamped to the substrate at one end 1005. It could be manufactured using standard silicon on insulator (SOI) MEMS processes, which is typically compatible with CMOS technology. The beam 1010 is 50 micrometers wide (out of plane) and 3 micrometers thick, so any motion is in-plane. The free end 1015 is connected to a double-parallelogram linear stage 1022. Inside the linear stage 1022 is a large parallel-plate electrostatic actuator 1024 with a designed gap of 700 nanometers, which applies a compressive force of up to 700 micronewtons along the beam 1010 axis. In the center is an approximately 4 microgram mass 1012 with 12 square holes arranged in a grid. Within each hole is a separate electrode 1025, each of which can be used as a capacitive sensor or low-force actuator, in the vertical direction. With no compression, the natural frequency is about 20 kHz.

The amount of axial motion at the electrostatic actuator (electrode 1025) required to traverse the entire range of stiffnesses (full + to full −) is only 70 nanometers, not enough to encounter significant nonlinearity associated with the changing gap distance.

The mechanism which senses the beam 1010 motion in the embodiment 1000 of FIG. 10 could be a simple capacitive sensor (electrode 1025). Alternative sensors include piezoelectric sensors, resistive sensors (strain gauges), optical sensors, and other standard micro-sensing technologies. The electrical signal from the sense portion (electrode 1025) is then fed back into a drive portion 1045, so that the driving force 1014 is in phase with (amplifies) any motion. In the case of the electrostatic sensor (electrode 1025), it is possible to use the same plate as both sense and drive portion, the current output through the sense portion is simply amplified and fed back into the sensor. In the case that a drive portion is used, the gain must be adjusted so that the beam does not spontaneously resonate. This gain is governed by the impedance of a SDOF oscillator, $$Z=i(m\omega-K/\omega)+\lambda-l^2B^2(G-1)/R.$$

where Z is the impedance, K the stiffness, omega the natural frequency, m the mass, lambda the damping, $l^2B^2/R$ some amplifier properties, and G the gain. As long as the gain G is chosen so that the real part of the impedance is above zero, the beam will function as an amplifier without spontaneous resonance, also known as feedback.

Note that the drive portion 1045 is a very low force high frequency actuator as compared to the tuning portion 1020 which is a low frequency high force actuator. Separating these two components is a key differentiator compared to other state of the art approaches where the tuning portion and drive portion operate in similar frequency and force ranges. Our approach leverages large deformation nonlinear mechanics to change the inherent frequency properties of the resonator spring rather than applying energy at the oscillator frequency to tune the stiffness, as is commonly done in current non-linear and tunable frequency oscillators. The result is a simpler controller that suffers much less from stability issues as compared to other current approaches.

One use of various embodiments is to couple its response to an external signal. In one embodiment, that signal is simply an electronic voltage from, for example, the output of an antenna, applied through one of the electrostatic actuators within the central mass.

Figure 11:
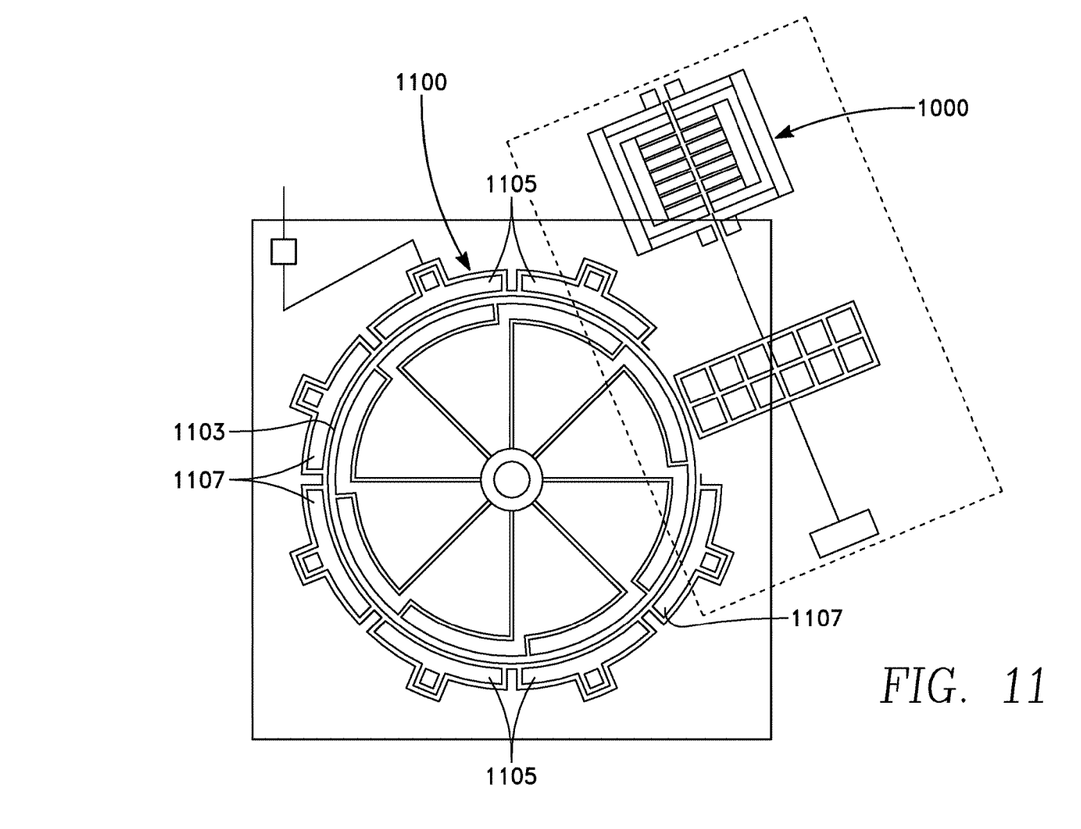
FIG. 11 is a top view illustration of the mechanical amplifier embodiment of FIG. 10 applied to resonating ring (wine-glass model) gyroscope.

An embodiment could also be coupled to a physical sensor, such as a gyroscope 1100 as drawn in FIG. 11. In this example, from U.S. Pat. No. 6,471,883 B1, a ring 1103 is driven to resonate in a wine-glass mode shape by 4 driving electrodes 1105. When rotated, a $2^{nd}$ orthogonal mode can be sensed by a set of 4 sensing electrodes 1107 (3 shown in FIG. 11). Unfortunately, the motion of the $2^{nd}$ mode is extremely weak, and it can be challenging to measure it with simple sensing electrodes 1107. If a sense electrode were replaced with the mechanical amplifier 1000, electrostatically coupled at one of the $2^{nd}$ mode nodes, it could amplify that signal before being sensed by electrodes 1025 (FIG. 10) within the central amplifier mass 1012 (FIG. 10). To further improve the response and reject noise, the amplifier circuit (between sense and drive) could be modulated to respond only in phase with the driving electrodes, functioning as a mechanical lock-in amplifier.

This is but only one example of a sensor that could be amplified. There are many resonant micro-sensors which are either difficult to sense, or which perform better when designed with very small motions. Coupling between amplifier and structure could be either by direct contact, weak contact (through a leverage mechanism), or non-contact method (i.e. electrostatic, magnetostatic, etc.). Another coupling method would be through indirect coupling through the foundation support of the two oscillators such as in Huygens' famous pendulum experiments. The foundation coupling stiffness must be tailored to provide sufficient coupling between structures without becoming so soft as to isolate the structures. If the foundation is too stiff coupling would not occur.

In one embodiment, a variable stiffness mechanical oscillator is provided having a variable stiffness beam whose stiffness is tuned through application of compressive force to at least one end of the beam (up to and including negative stiffnesses). In such an embodiment, a tuning actuator is connected to the root of the beam, with sufficient force to change the stiffness of the beam more than 5% and up to 200%. A sensing portion is provided to sense the displacement, velocity, or acceleration of that beam. This represents the "amplified" signal of the amplifier. A coupling portion provides a signal to be amplified. This signal can be electrical, as if from an antenna, or physically coupled from a sensor, such as a microphone diaphragm.

In some embodiments the oscillator may further include a static positive stiffness beam. The oscillator may still further include a driving actuator, which amplifies the motion of the beam by feeding back the sensor signal in-phase with the oscillation. The driving actuator may include an adjustable gain, which is tuned below the level of self-excitation (spontaneous resonance). If the signal phase is known (such as with a gyroscope) the driving actuator can be amplified in phase with the signal for further noise rejection.

In some embodiments the oscillator may have an actuator which includes at least one of a piezoelectric portion, a magnetostrictive portion, an electromagnetic portion, a thermal expansion portion, or a ionic or electrochemical portion. The ionic or electrochemical portion may be used as a sensor to sense the state of the negative stiffness portion.

In some embodiments the oscillator is configured to be operated in a vacuum.

In some embodiments the oscillator is fabricated with silicon, silicon dioxide, and/or single crystal quartz. The oscillator may be configured as part of an electrical filtering network.

It is worth noting that any reference to "one embodiment/implementation" or "an embodiment/implementation" means that a particular feature, structure, action, or characteristic described in connection with the embodiment/implementation may be included in an embodiment/implementation, if desired. The appearances of the phrase "in one embodiment/implementation" in various places in the specification are not necessarily all referring to the same embodiment/implementation.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or member can actually be representative or equivalent members. Again, these are implicitly included in this disclosure. Where the invention is described in device-oriented terminology, each member of the device implicitly performs a function. It should also be understood that a variety of changes may be made without departing from the essence of the invention. Such changes are also implicitly included in the description. These changes still fall within the scope of this invention.

Further, each of the various members of the invention and claims may also be achieved in a variety of manners. This disclosure should be understood to encompass each such variation, be it a variation of any apparatus embodiment, a method embodiment, or even merely a variation of any member of these. Particularly, it should be understood that as the disclosure relates to members of the invention, the words for each member may be expressed by equivalent apparatus terms even if only the function or result is the same. Such equivalent, broader, or even more generic terms should be considered to be encompassed in the description of each member or action. Such terms can be substituted where desired to make explicit the implicitly broad coverage to which this invention is entitled. It should be understood that all actions may be expressed as a means for taking that action or as a member which causes that action. Similarly, each physical member disclosed should be understood to encompass a disclosure of the action which that physical member facilitates. Such changes and alternative terms are to be understood to be explicitly included in the description.

While the present invention has been described in connection with certain exemplary embodiments, it is to be understood that the invention is not limited to the disclosed embodiments; on the contrary, it is intended to cover various modifications and equivalent arrangements included within the spirit and scope of the appended claims, and equivalents thereof.

What is claimed is:

1. A tunable stiffness mechanical filter comprising:
    a) a negative stiffness structure comprising an elastic negative stiffness characteristic;
    b) an input coupler to the negative stiffness structure;
    c) a tuner for the negative stiffness structure;
    d) an output sensor located along the negative stiffness structure; and
    e) wherein the tuner is configured to apply an axial force along a tuning axis of the negative stiffness structure, and wherein the input coupler is configured to apply an input transverse to the tuning axis.

2. The filter of claim 1 further comprising an amplifier coupled between the output sensor and the negative stiffness structure.

3. The filter of claim 2 further comprising a driver coupled between the sensor and the negative stiffness structure.

4. The filter of claim 3, wherein the driver has an adjustable gain.

5. The filter of claim 1 further comprising a driver coupled between the output sensor and the negative stiffness structure.

6. The filter of claim 1 further comprising:
    a) wherein the negative stiffness structure comprises a negative stiffness member comprising a first end and a second end;
    b) wherein the tuner is coupled to at least one of the first end or the second end of the negative stiffness member to allow application of a compressive tuning force to the negative stiffness member axially along the tuning axis;
    c) wherein the input coupler is adapted to receive an input signal, transverse to the tuning axis, for causing displacement of the negative stiffness member; and
    d) wherein the output sensor is positioned to sense at least one of: (1) a displacement; (2) a velocity; or (3) an acceleration of the negative stiffness member.

7. The filter of claim 6 further comprising a drive amplifier coupled to amplify the least one of: (1) a displacement; (2) a velocity; or (3) an acceleration of the negative stiffness member.

8. The filter of claim 6, wherein the tuner further comprises at least one of: (a) an electrostatic actuator; (b) an electromagnetic actuator; (c) a magnetostrictive actuator; (d) a thermal actuator; (d) an electrochemical actuator; e) ionic actuator; or (f) a piezoelectric.

9. The filter of claim 8, wherein at least one of the first end or the second end of the negative stiffness member is secured to a piezoelectric substrate.

10. The filter of claim 6 further comprising a lever system.

11. The filter of claim 6, wherein the negative stiffness member is fixed at the first end, and wherein the tuner is coupled to the second end.

12. The filter of claim 11, wherein the second end is clamped to inhibit rotation of the negative stiffness member while allowing compression of the negative stiffness member along the tuning axis.

13. The filter of claim 11, wherein the negative stiffness member further comprises flexure features.

14. The filter of claim 11, further comprising a positive stiffness member coupled in parallel with the negative stiffness member.

15. The filter of claim 14, wherein the positive stiffness positive stiffness member comprises flexure features.

16. A tunable stiffness mechanical filter comprising:
  a) an elastic negative stiffness member;
  b) an input coupler adapted to couple an input force to the negative stiffness member;
  c) an output sensor is positioned to sense a response of the negative stiffness member to the input force;
  d) a tuning actuator coupled to the negative stiffness member so as to adjust the response of the negative stiffness member to the input force;
  e) a drive portion coupled to provide feedback from the output sensor to the negative stiffness structure; and
  f) wherein the negative stiffness member is secured at one end such that application of a tuning force by the tuning actuator at an other end of the negative stiffness member compresses the negative stiffness member axially to adjust the response of the negative stiffness member to the input force, and wherein the drive portion amplifies and feeds back the response of the negative stiffness member.

17. The filter of claim 16, wherein the tuning actuator comprises a piezoelectric.

18. A tunable stiffness mechanical filter comprising:
  a) a variable stiffness beam comprising a variable stiffness characteristic tuned through axial application of compressive force to at least one end of the variable stiffness beam;
  b) an input coupler to supply an input to the variable stiffness beam;
  c) a tuner coupled to a first end of the variable stiffness beam; and
  d) a sensor adapted to sense at least one of: (1) a displacement; (2) a velocity; or (3) an acceleration of the variable stiffness beam.

19. The filter of claim 18, wherein the variable stiffness beam comprises an elastic negative stiffness characteristic in response to the application of the compressive force.

20. The filter of claim 19 further comprising a static positive stiffness beam coupled in parallel with the variable stiffness beam.

21. The filter of claim 19, wherein the tuner is capable of application of sufficient force to change the stiffness of the variable stiffness beam more than about 5% to up to about 200%.

22. The filter of claim 19 further comprising a driver coupled between the sensor and the variable stiffness beam, wherein the driver has an adjustable gain.

23. The filter of claim 19 further comprising a driver coupled so as to amplify a motion of the variable stiffness beam by feeding back a sensor signal in-phase with an oscillation of the variable stiffness beam and wherein the driver is tuned below a level of self-excitation so as to inhibit spontaneous excitation.

24. The filter of claim 19 further comprising a driver coupled between the sensor and the variable stiffness beam, wherein the driver is tuned to provide in-phase amplification of a known frequency input signal.

25. A tunable stiffness mechanical filter comprising:
  a) a negative stiffness structure comprising a negative stiffness characteristic;
  b) an input coupler to the negative stiffness structure;
  c) a tuner for the negative stiffness structure;
  d) an output sensor located along the negative stiffness structure;
  e) wherein the negative stiffness structure comprises a negative stiffness member comprising a first end and a second end;
  f) wherein the tuner is coupled to at least one of the first end or the second end of the negative stiffness member to allow application of a compressive tuning force to the negative stiffness member along a tuning axis;
  g) wherein the input coupler is adapted to receive an input signal, transverse to the tuning axis, for causing displacement of the negative stiffness member;
  h) wherein the output sensor is positioned to sense at least one of: (1) a displacement; (2) a velocity; or (3) an acceleration of the negative stiffness member;
  i) wherein the tuner further comprises at least one of: (1) an electrostatic actuator; (2) an electromagnetic actuator; (3) a magnetostrictive actuator; (4) a thermal actuator; (5) an electrochemical actuator; (6) an ionic actuator; or (7) a piezoelectric; and
  j) wherein at least one of the first end or the second end of the negative stiffness member is secured to a piezoelectric substrate.

* * * * *